United States Patent
Park

(10) Patent No.: US 7,675,322 B2
(45) Date of Patent: Mar. 9, 2010

(54) LEVEL SHIFTING CIRCUITS FOR GENERATING OUTPUT SIGNALS HAVING SIMILAR DUTY CYCLE RATIOS

(75) Inventor: Dong-Uk Park, Gyeonggi-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 55 days.

(21) Appl. No.: 12/070,841

(22) Filed: Feb. 21, 2008

(65) Prior Publication Data

US 2008/0204079 A1   Aug. 28, 2008

(30) Foreign Application Priority Data

Feb. 23, 2007   (KR) .................... 10-2007-0018133

(51) Int. Cl.
    *H03K 19/0175* (2006.01)
(52) U.S. Cl. .............. 326/81; 326/68; 326/83; 327/333
(58) Field of Classification Search .......... 326/63, 326/68, 81, 83; 327/333
    See application file for complete search history.

(56) References Cited

U.S. PATENT DOCUMENTS 6,046,621 A * 4/2000 Crowley ............. 327/333
6,504,400 B2 * 1/2003 Tanaka et al. ............. 326/68
6,954,099 B2 * 10/2005 Brox ..................... 327/333
7,400,168 B2 * 7/2008 Katou .................... 326/68
2001/0043092 A1 11/2001 McDaniel
2005/0156652 A1 * 7/2005 Rao et al. ............... 327/333
2005/0285658 A1 12/2005 Schulmeyer et al.
2007/0222479 A1 * 9/2007 Aoki ...................... 326/83

FOREIGN PATENT DOCUMENTS

| JP | 11-239051   | 8/1999 |
| JP | 2004-236164 | 8/2004 |

* cited by examiner

*Primary Examiner*—Vibol Tan
(74) *Attorney, Agent, or Firm*—Myers Bigel Sibley & Sajovec, P.A.

(57) ABSTRACT

A level shifting circuit includes a level shifting unit and an output buffer unit. The level shifting unit generates first and second output signals responsive to first and second input signals. The first and second input signals range between first and second voltage levels, and the first and second input signals are a first differential pair. The first and second output signals range between the first voltage level and a third voltage level greater than the second voltage level, and the first and second output signals are a second differential pair. The output buffer unit inverts the first and second output signals to provide third and fourth output signals, respectively. Duty ratios of the first and second output signals are determined based on delay times of the first and second input signals.

8 Claims, 6 Drawing Sheets

LEVEL SHIFTING CIRCUITS FOR GENERATING OUTPUT SIGNALS HAVING SIMILAR DUTY CYCLE RATIOS

CROSS-REFERENCE TO RELATED APPLICATION

This application claims the benefit of and priority to Korean Patent Application No. 2007-0018133, filed on Feb. 23, 2007, in the Korean Intellectual Property Office (KIPO), the disclosure of which is hereby incorporated herein by reference as if set forth in its entirety.

BACKGROUND OF THE INVENTION

1. Field of the Invention

The present invention relates to semiconductor integrated circuits (ICs), and, more particularly, to level shifting circuits.

2. Description of the Related Art

Most semiconductor ICs have a core circuit part for essential functions and an interfacing circuit part for interfacing with external circuits. In addition, most semiconductor ICs may include circuit blocks for various functions and power supply voltages for the respective circuit blocks may be different from each other. For example, most circuit blocks in a semiconductor IC operate with a relatively low power supply voltage under 1.3[V], whereas an analog circuit block that interfaces with external circuits typically operates with a relatively high power supply voltage of about 2.5[V]~3.3[V].

As such, there are voltage level differences among the circuit blocks that operate with different power supply voltages, which may result in the use of level shifters as interfaces between various circuit blocks.

FIG. 1 is a circuit diagram that illustrates a conventional level shifting circuit Referring to FIG. 1, a conventional level shifter includes N-type metal-oxide-semiconductor (NMOS) transistors MN1 and MN2 that receive differential input signals IN and INB and P-type metal-oxide-semiconductor (PMOS) transistors MP1 and MP2 that are coupled to each other in a latch configuration. The PMOS transistors MP1 and MP2 provide differential output signals OUT and OUTB at drains thereof respectively.

When the input signal IN transitions from a logic low level to a logic high level, and the input signal INB transitions from a logic high level to a logic low level, the NMOS transistor MN1 transitions from the off state to the on state and the NMOS transistor MN2 transitions from the on state to the off state. A node N2 then transitions from the logic high level to the logic low level due to a current sinking operation of the NMOS transistor MN1. During the current sinking operation of the NMOS transistor MN1, when a voltage level of the node N2 drops from a logic high level to VDDH-Vth (threshold voltage of the PMOS transistor MP2), the PMOS transistor MP2 is turned on and a node N1 transitions from the logic low level to the logic high level. Accordingly, the node N1 transitions after the node N2 transitions, which results in a delay time difference. Therefore, there is a mismatch of duty ratios of the differential output signals OUT and OUTB.

In summary, conventional level shifter circuits may generate differential output signals that have a mismatch in duty ratios due to the delay time difference of the differential output signals.

SUMMARY

Some example embodiments of the present invention provide a level shifting circuit that may substantially match duty ratios of output signals.

In some example embodiments of the present invention, a level shifting circuit includes a level shifting unit and an output buffer unit. The level shifting unit generates first and second output signals responsive to first and second input signals. The first and second input signals range between first and second voltage levels, and the first and second input signals are a first differential pair. The first and second output signals range between the first voltage level and a third voltage level greater than the second voltage level, and the first and second output signals being a second differential pair. The output buffer unit inverts the first and second output signals to provide third and fourth output signals, respectively. Duty ratios of the first and second output signals may be determined based on delay times of the first and second input signals.

In some embodiments, the level shifting unit may include an output unit, coupled to a high power supply voltage node that provides the first and second output signals, a delay control unit, coupled to the output unit, that controls the delay times of the first and second input signals to substantially match duty ratios of the first and second output signals, and an input unit, coupled to the delay control unit and a ground voltage node, that receives the first and second input signals.

In some embodiments, the output unit may include a cross-coupled latch having first and second P-type metal-oxide-semiconductor (PMOS) transistors. A gate terminal of the first PMOS transistor is coupled through the delay control unit to a drain terminal of a second PMOS transistor. Source terminals of the first and second PMOS transistors are coupled to the high power supply voltage node. The first and second output signals may be provided at drain terminals of the first and second PMOS transistors, respectively.

In some embodiments, the input unit may include first and second N-type metal-oxide-semiconductor (NMOS) transistors having gate terminals to which the first and second input signals are respectively provided, and source terminals that are coupled to the ground voltage node.

In some embodiments, the delay control unit may include a first transmission gate coupled between the drain terminal of the first PMOS transistor and the drain terminal of the first NMOS transistor and a second transmission gate coupled between the drain terminal of the second PMOS transistor and the drain terminal of the second NMOS transistor. Delay times of the first and second transmission gates may be substantially the same. The first and second PMOS transistors may have thick gate oxide layers for a high power supply voltage. The first and second NMOS transistors may have thin gate oxide layers for a low power supply voltage.

In some example embodiments of the present invention, a level shifting circuit includes a first NMOS transistor, a second NMOS transistor, a first transmission gate, a second transmission gate, a first PMOS transistor, and a second PMOS transistor. The first NMOS transistor has a source terminal coupled to a ground voltage node, and a gate terminal that receives a first input signal. The second NMOS transistor has s source terminal coupled to the ground voltage node, and a gate terminal that receives a second input signal.

The first and second input signals are a first differential pair. The first PMOS transistor has a gate terminal coupled to a drain terminal of the second NMOS transistor, a source terminal coupled to a high power supply voltage node, and a drain terminal coupled to the first transmission gate, at which a first output signal is provided. The second PMOS transistor has a gate terminal coupled to a drain terminal of the first NMOS transistor, a source terminal coupled to the high power supply voltage node, and a drain terminal coupled to the second transmission gate, at which a second output signal is provided. The first and second output signals are a second differential pair. The first and second input signals range between first and second voltage levels. The first and second output signals range between the first voltage level and a third voltage level greater than the second voltage level. Duty ratios of the first and second output signals may be determined based on delay times of the first and second input signals.

In some embodiments, the level shifting circuit may further include an output buffer unit configured to invert the first and second output signals to provide third and fourth output signals, respectively. The output buffer unit may include a first inverter that inverts the first output signal to provide the third output signal and a second inverter that inverts the second output signal to provide the fourth output signal.

In some example embodiments of the present invention, a level shifting circuit includes an input signal conversion unit, an input unit, a delay control unit, and an output unit. The input signal conversion unit, coupled between a low power supply voltage node and a ground voltage node, changes a single-ended input signal into first and second input signals that range between first and second voltage levels and have duty ratios substantially matched with each other. The first and second input signals are a first differential pair. The input unit, coupled to the ground voltage node, receives the first and second input signals. The delay control unit, coupled to the input unit, controls delay times of the first and second input signals to provide delay time-controlled first and second input signals. The output unit, coupled to the delay control unit and a high power supply voltage node, receives the delay time-controlled first and second input signals to provide first and second output signals that range between the first voltage level and a third voltage level greater than the second voltage level and have duty ratios matched with each other. The first and second output signals are a second differential pair.

In some embodiments, the level shifting circuit may further include an output buffer unit that inverts the first and second output signals to provide third and fourth output signals, respectively.

The level shifting circuits according to some embodiments of the present invention may substantially match duty ratios of differential output signals and improve timing margins for interfacing with other circuits.

DETAILED DESCRIPTION OF EMBODIMENTS OF THE INVENTION

Figure 1:
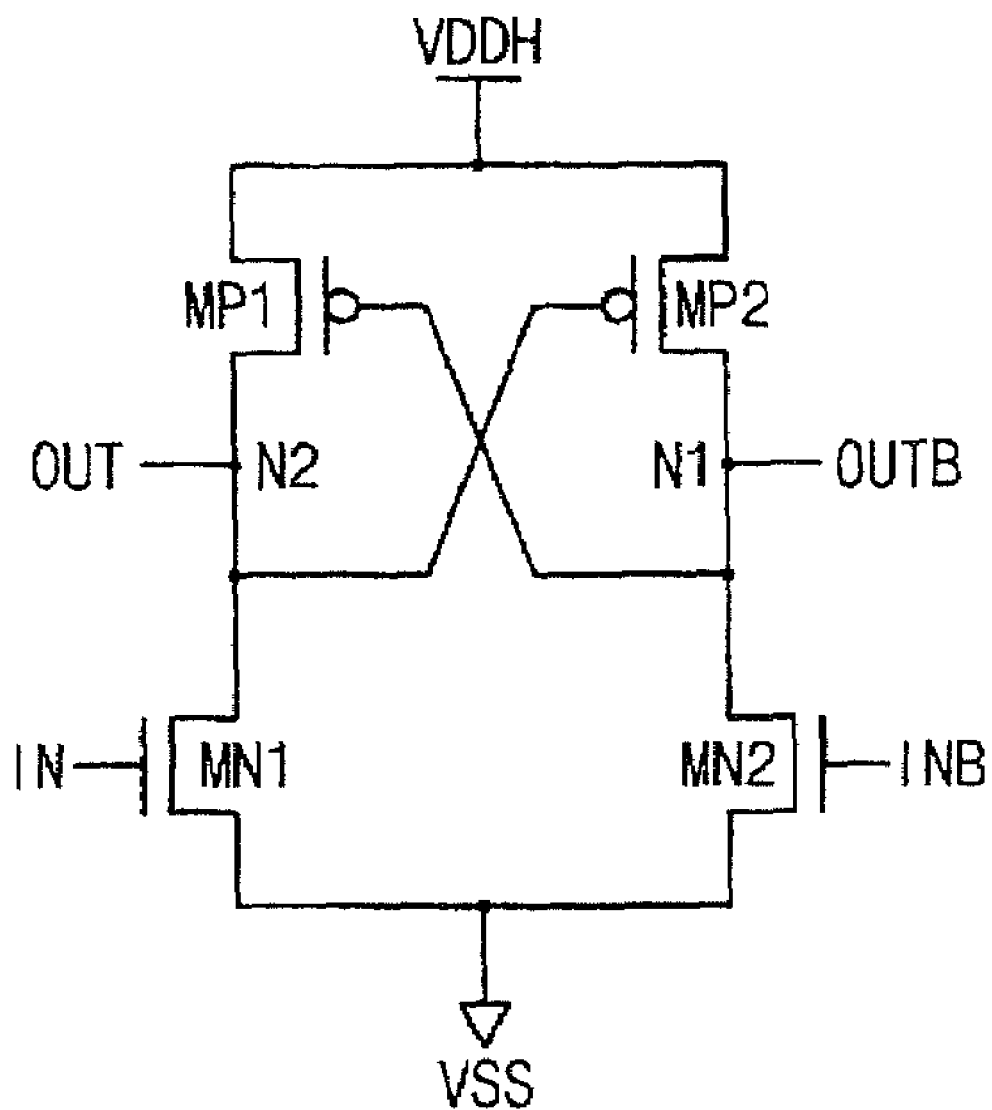
FIG. 1 is a circuit diagram that illustrates a conventional level shifter circuit.

Embodiments of the present invention now will be described more fully with reference to the accompanying drawings, in which embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
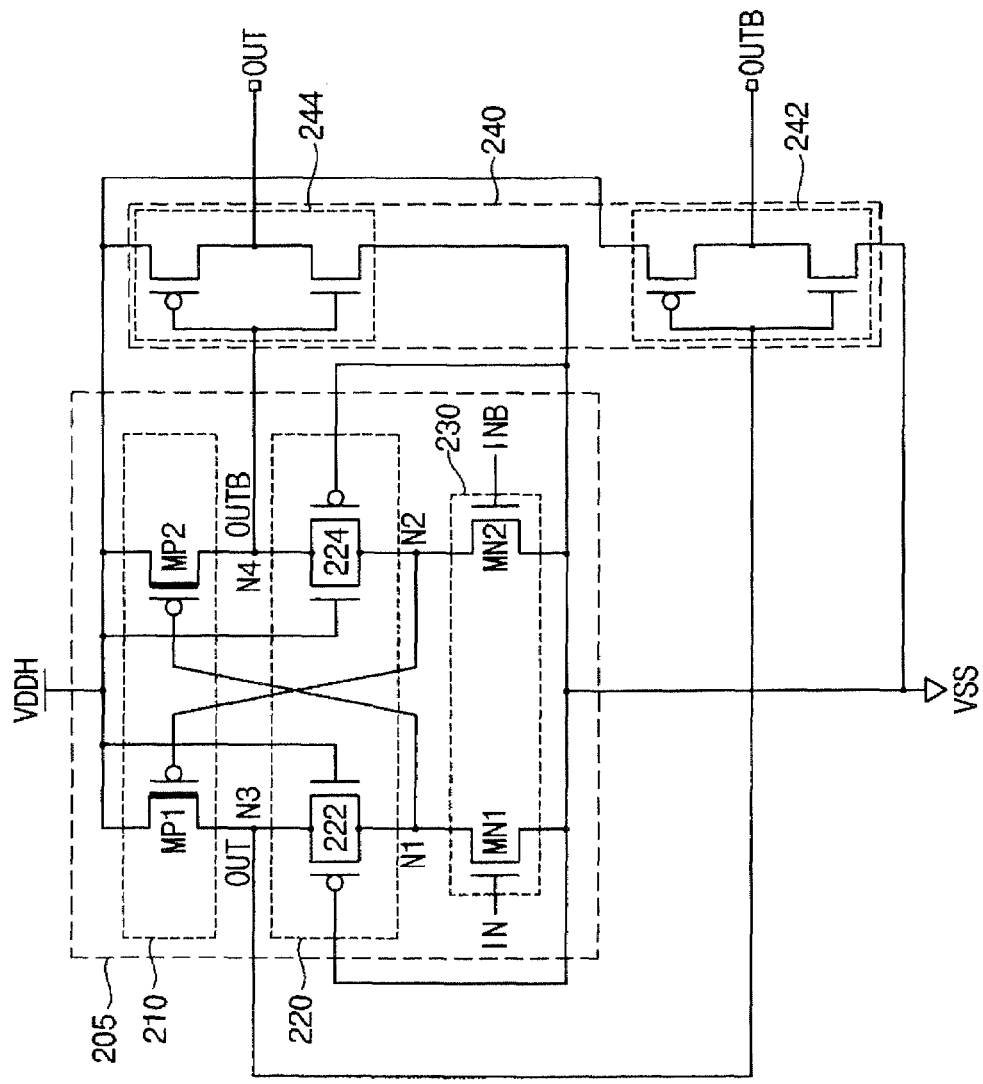
FIG. 2 is a circuit diagram that illustrates a level shifting circuit according to some embodiments of the present invention.

FIG. 2 is a circuit diagram that illustrates a level shifting circuit according to some embodiments of the present invention.

Referring to FIG. 2, a level shifting circuit 200 according to some embodiments of the present invention includes a level shifting unit 205 and an output buffer unit 240.

The level shifting unit 205 receives first and second input signals IN and INB to provide first and second output signals OUT and OUTB. Voltage levels of the first and second input signals IN and INB swing between a low power supply voltage (VDDL) and a ground voltage (VSS). Voltage levels of the first and second output signals OUT and OUTB swing between a high power supply voltage (VDDH) and the ground voltage VSS. The first and second input signals IN and INB are differential signals, and the first and second output signals OUT and OUTB are also differential signals.

The output buffer unit 240 inverts the first and second output signals OUT and OUTB to provide third and fourth output signals OUTB and OUT. The output buffer unit 240 may include a first inverter 242 and a second inverter 244.

The level shifting unit 205 includes an output unit 210, a delay control unit 220, and an input unit 230.

The output unit 210 is coupled to a node that provides the voltage VDDH, and generates the first and second output signals OUT and OUTB. The output unit 210 includes cross-coupled PMOS transistors MP1 and MP2 in a latch configuration. The PMOS transistor MP1 has a source coupled to the VDDH voltage node, and a gate terminal coupled via the delay control unit 220 to a drain terminal of the PMOS transistor MP2. The first output signal OUT is provided at a drain terminal of the PMOS transistor MP1. The PMOS transistor MP2 has a source terminal coupled to the VDDH voltage node, and a gate terminal coupled via the delay control unit 220 to the drain terminal of the PMOS transistor MP1. The second output signal OUTB is provided at the drain terminal of the PMOS transistor MP2. The PMOS transistors MP1 and MP2 may have a thick gate oxide layer for a high power supply voltage.

The input unit 230 is coupled to the delay control unit 220 and a node that provides a common reference voltage VSS, and receives the first and second input signals IN and INB. The input unit 230 includes NMOS transistors MN1 and MN2. The NMOS transistor MN1 has a source terminal coupled to the VSS voltage node, and a gate terminal that receives the first input signal IN. The NMOS transistor MN2 has a source terminal coupled to the VSS voltage node, and a gate terminal that receives the second input signal INB. The NMOS transistors MN1 and MN2 may have a thin gate oxide layer for a low power supply voltage.

The delay control unit 220 is coupled between the output unit 210 and the input unit 230, and controls delay times of the first and second input signals IN and INB to be provided to the output unit 210. The delay control unit 220 includes a first transmission gate 222 and a second transmission gate 224. The first transmission gate 222 is coupled between the drain terminal of the PMOS transistor MP1 and the drain terminal of the NMOS transistor MN1. The second transmission gate 224 is coupled between the drain terminal of the PMOS transistor MP2 and the drain terminal of the NMOS transistor MN2.

Hereinafter, exemplary operations of the level shifting circuit 200 are described with reference to FIG. 2.

When the first input signal IN transitions from a logic low level to a logic high level, and the second input signal INB transitions from a logic high level to a logic low level, the NMOS transistor MN1 transitions from an off state to an on state, and the NMOS transistor MN1 transitions from an on state to an off state.

While the NMOS transistor MN2 is turned on, the NMOS transistor MN2 performs a pull-down operation and a node N2 becomes logic low. Therefore, the PMOS transistor MP1 is turned on to cause nodes N3 and N1 to become logic high. When the NMOS transistor MN1 transitions from an off state to an on state, the node N1 becomes logic low by a pull-down operation of the NMOS transistor MN1. When the node N1 transitions from a logic high level to a logic low level, a current path is formed via the PMOS transistor MP1, a first transmission gate 222, and the NMOS transistor MN1. Consequently, a current flows from the VDDH node to the VSS node. That is, there occurs some time delay for the current to propagate through the PMOS transistor MP1 and a first transmission gate 222.

When a voltage level at node N1 drops from a logic high level to a level of VDDH-Vth (a threshold voltage of the PMOS transistor MP2), the PMOS transistor MP2 is turned on, and a current from the VDDH node is provided to a node (N4) through the PMOS transistor MP2. In this case, a voltage level of the node N2 appears at the node N4 via the second transmission gate 224. Therefore, when a delay time of the PMOS transistor MP1 is substantially the same as a delay time of the second transmission gate 224, the voltage levels of the nodes N3 and N4 transition from a logic low level to a logic high level (or from a logic high level to a logic low level) substantially at the same time. When the voltage levels of the nodes N3 and N4 transition from a logic low level to a logic high level (or from a logic high level to a logic low level) substantially simultaneously, the third and the fourth output signals OUTB and OUT provided through the inverters 242 and 244 in the output buffer unit 240 also transition from a logic high level to a logic low level (or from a logic low level to a logic high level) substantially simultaneously. Thus, duty ratios of the third and the fourth output signals OUTB and OUT may be substantially matched with each other.

Figure 3A:
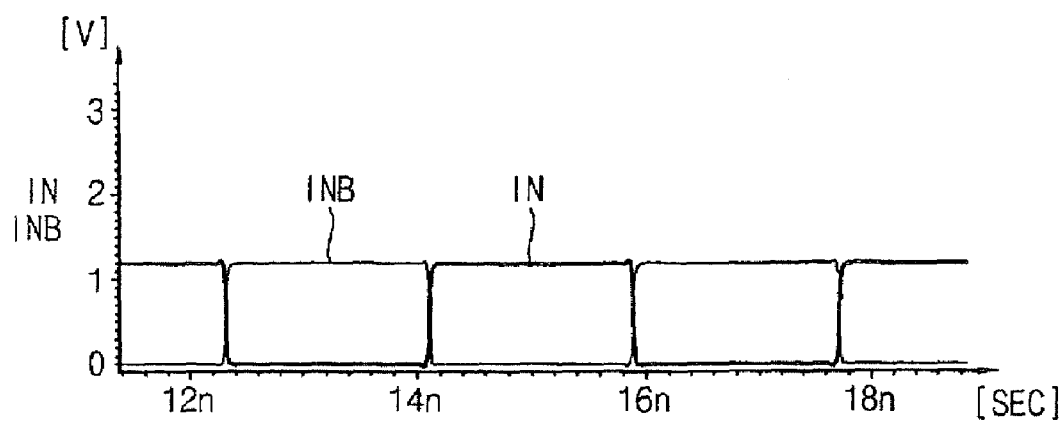
FIGS. 3A and 3B are simulation diagrams that illustrate input signals and output signals of the level shifting circuit of FIG. 2 according to some embodiments of the present invention.
Figure 3B:
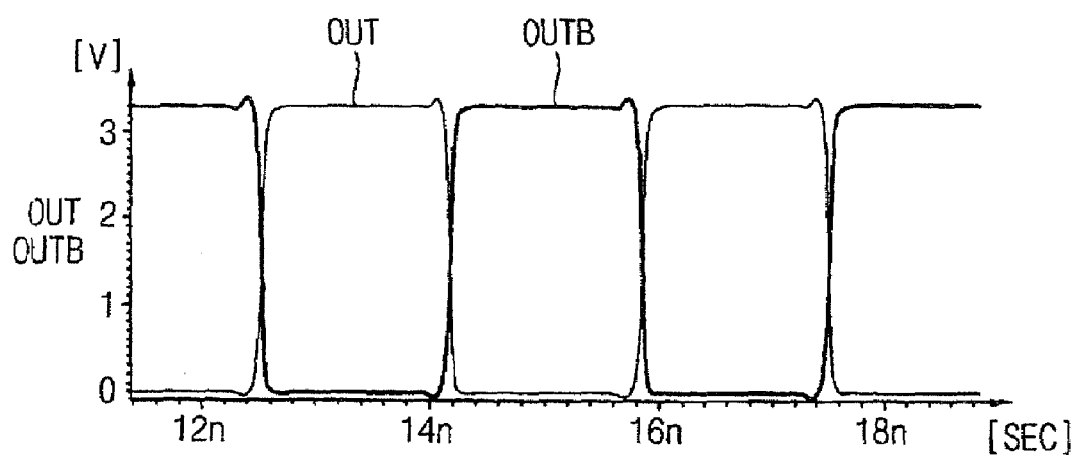

FIGS. 3A and 3B are simulation diagrams that illustrate input signals and output signals of the level shifting circuit of FIG. 2 according to some embodiments of the present invention.

Referring to FIGS. 3A and 3B, when the first and second input signals IN and INB have voltage levels of about 1.2[V] at about 300 [MHz], the third and fourth output signals OUTB and OUT have voltage levels of about 3.3[V]. In addition, a duty ratio of the third output signal OUTB is about 50.1:49.9, and a duty ratio of the fourth output signal OUT is about 50.5:49.5. That is, duty ratios of the third and fourth output signals OUTB and OUT are about 1:1 and are substantially matched with each other.

Figure 4:
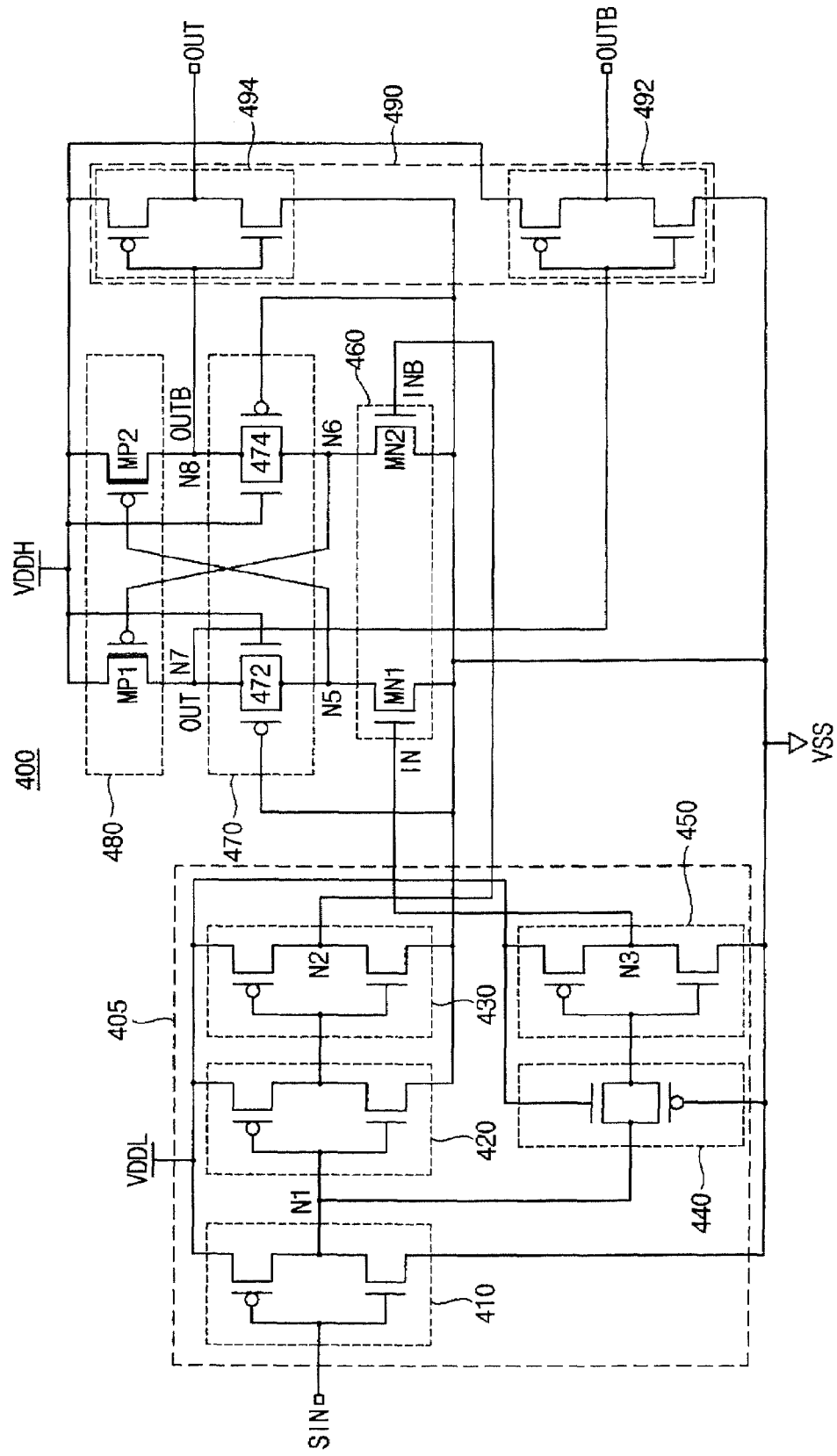
FIG. 4 is a circuit diagram that illustrates a level shifting circuit according to further embodiments of the present invention.

FIG. 4 is a circuit diagram that illustrates a level shifting circuit according to some embodiments of the present invention.

Referring to FIG. 4, a level shifting circuit 400 according to some embodiments of the present invention includes an input signal conversion unit 405, an input unit 460, a delay control unit 470, and an output unit 480. The level shifting circuit 400 may further include an output buffer unit 490.

The input signal conversion unit 405 changes a single-ended input signal SIN into first and second input signals IN and INB. The input signal conversion unit 405 may include inverters 410, 420, 430 and 450 and a transmission gate 440. Delay times of the inverter 420 and the transmission gate 440 may, in some embodiments, be substantially the same as each other. Accordingly, when the single-ended input signal SIN is input, duty ratios of the first and second input signals IN and INB output at nodes N3 and N2 through a node N1 may be substantially the same with each other. The voltage levels of the first and second input signals IN and INB swing between VDDL and VSS.

The input unit 460 is coupled to the VSS node, and receives the first and second input signals IN and INB. The input unit 460 includes NMOS transistors MN1 and MN2. The NMOS transistor MN1 has a source terminal coupled to the VSS node, and a gate terminal that receives the first input signal IN. The NMOS transistor MN2 has a source terminal coupled to the VSS node, and a gate terminal that receives the second input signal INB. The NMOS transistors MN1 and MN2 may have a thin gate oxide layer for a low power supply voltage.

The output unit 480 is coupled to the delay control unit 470 and the VDDH node, and receives delay time-controlled first and second input signals IN and INB to provide the first and second output signals OUT and OUTB. The output unit 480 includes cross-coupled PMOS transistors MP1 and MP2 in a latch configuration. The PMOS transistor MP1 has a source terminal coupled to the VDDH node, and a gate terminal coupled via the delay control unit 470 to a drain terminal of the PMOS transistor MP2. The first output signal OUT is provided at a drain terminal of the PMOS transistor MP1. The PMOS transistor MP2 has a source terminal coupled to the VDDH node, and a gate terminal coupled via the delay control unit 470 to the drain terminal of the PMOS transistor MP1. The second output signal OUTB is provided at the drain terminal of the PMOS transistor MP2. The PMOS transistors MP1 and MP2 may have a thick gate oxide layer for a high power supply voltage.

The delay control unit 470 is coupled to the input unit 460, and controls delay times of the first and second input signals IN and INB to be provided to the output unit 480. The delay control unit 470 includes a first transmission gate 472 and a second transmission gate 474. The first transmission gate 472 is coupled to the drain terminal of the PMOS transistor MP1 and the drain terminal of the NMOS transistor MN1. The second transmission gate 474 is coupled to the drain terminal of the PMOS transistor MP2 and the drain terminal of the NMOS transistor MN2.

The output buffer unit 490 inverts the first and second output signals OUT and OUTB to provide third and fourth output signals OUTB and OUT. The output buffer unit 490 may include a first inverter 492 that inverts the first output signal OUT to provide the third output signal OUTB and a second inverter 494 that inverts the second output signal OUTB to provide the fourth output signal OUT. Voltage levels of the first and second output signals swing between VDDH and VSS.

Hereinafter, exemplary operations of the level shifting circuit 400 will be described with reference to FIG. 4.

When the single-ended input signal SIN transitions from a logic low level to a logic high level, the first input signal IN transitions from a logic low level to a logic high level and the second input signal INB transitions from a logic high level to a logic low level. Accordingly, the NMOS transistor MN1 transitions from the off state to the on state, and the NMOS transistor MN1 transitions from the on state to the off state.

While the NMOS transistor MN2 is turned on, the NMOS transistor MN2 performs a pull-down operation and a node N6 becomes logic low. Therefore, the PMOS transistor MP1 is turned on to cause nodes N7 and N5 to become logic high. When the NMOS transistor MN1 transitions from the off state to the on state, the node N5 becomes logic low by a pull-down operation of the NMOS transistor MN1. When the node N5 transitions from a logic high level to a logic low level, a current path is formed via the PMOS transistor MP1, a first transmission gate 472, and the NMOS transistor MN1. Consequently, a current flows from the VDDH node to the VSS node. That is, there occurs some time delay for the current to propagate through the PMOS transistor MP1 and a first transmission gate 742.

When a voltage level of the node N5 drops from a logic high level to a level of VDDH-Vth (a threshold voltage of the PMOS transistor MP2), the PMOS transistor MP2 is turned on, and a current from the VDDH node is provided to a node N8 through the PMOS transistor MP2. In this case, a voltage level of the node N6 appears at the node N8 via the second transmission gate 474. Therefore, when a delay time of the PMOS transistor MP1 is substantially the same as a delay time of the second transmission gate 474, the voltage levels of the nodes N7 and N8 transition from a logic low level to a logic high level (or from a logic high level to a logic low level) substantially at the same time. When the voltages levels of the node N7 and N8 transition from a logic low level to a logic high level (or from a logic high level to a logic low level) substantially simultaneously, the third and the fourth output signals OUTB and OUT provided through the inverters 492 and 494 in the output buffer unit 490 also transition from a logic high level to a logic low level (or from a logic low level to a logic high level) substantially simultaneously. Thus, duty ratios of the third and the fourth output signals OUTB and OUT may be substantially matched with each other.

Figure 5A:
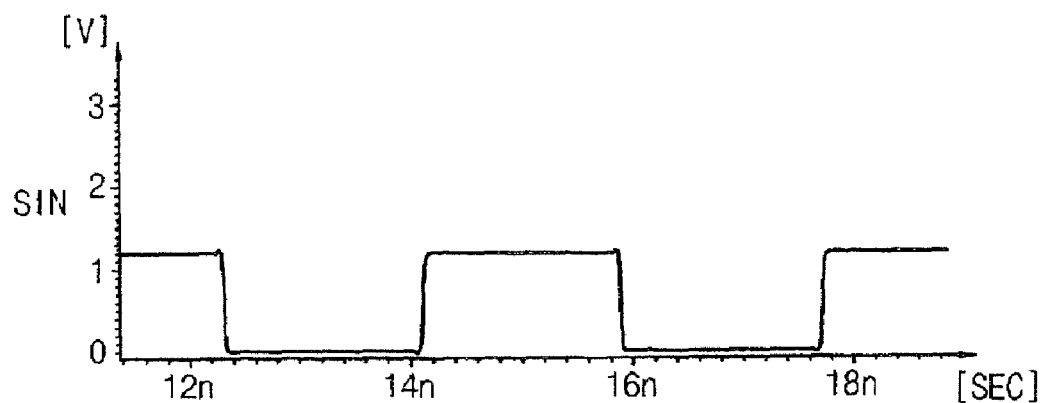
FIG. 5A is a simulation diagram that illustrates the single-ended input signal in the level shifting circuit of FIG. 4 according to some embodiments of the present invention.
Figure 5B:
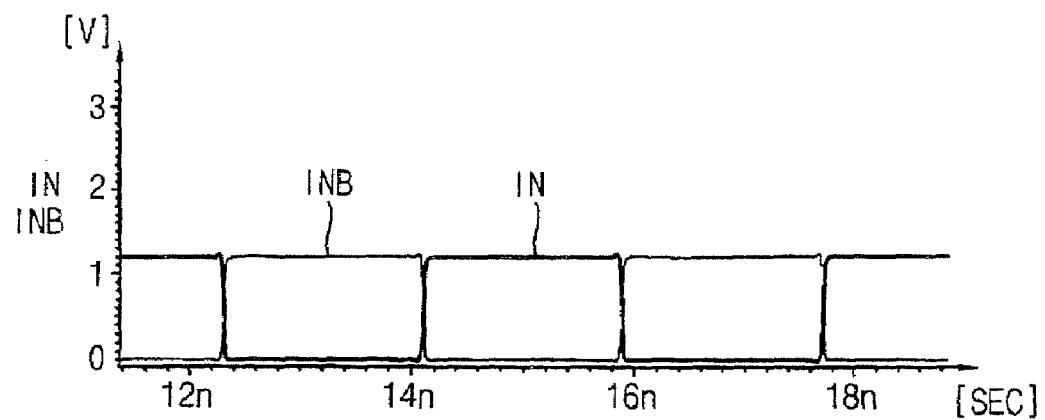
FIG. 5B is a simulation diagram that illustrates the input signals in the level shifter of FIG. 1 and the level shifting circuit of FIG. 4 according to some embodiments of the present invention.

FIG. 5A is a simulation diagram that illustrates the single-ended input signal in the level shifting circuit of FIG. 4, and FIG. 5B is a simulation diagram that illustrates the input signals in the level shifting circuit of FIG. 1 and the level shifting circuit of FIG. 4.

Figure 6A:
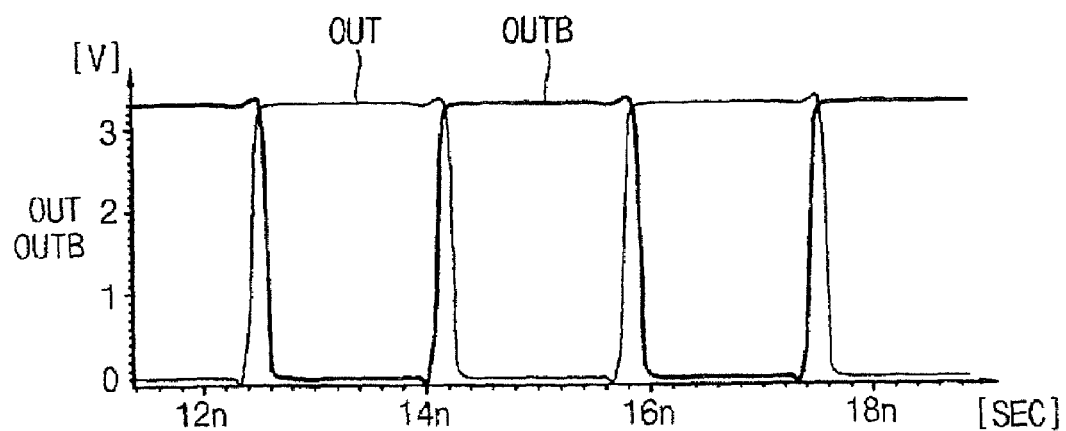
FIG. 6A is a simulation diagram that illustrates the output signals in the level shifting circuit of FIG. 1 according to some embodiments of the present invention.
Figure 6B:
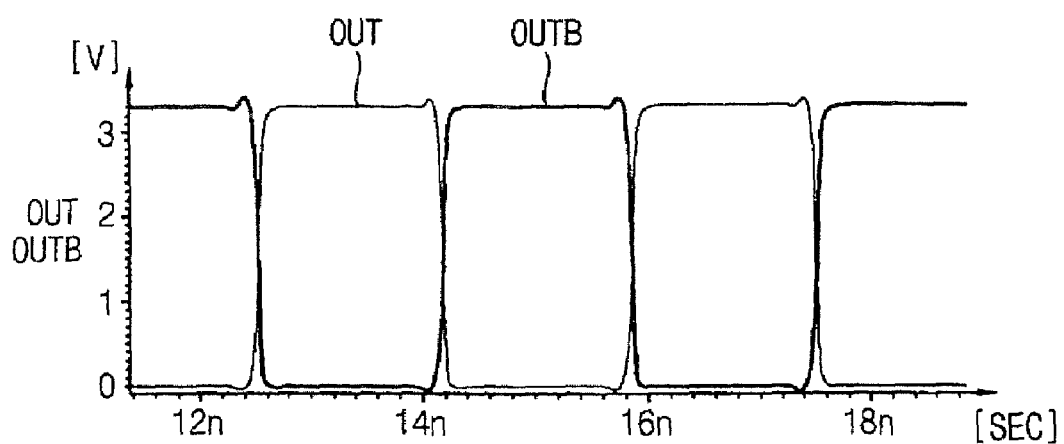
FIG. 6B is a simulation diagram that illustrates the output signals in the level shifting circuit of FIG. 4 according to some embodiments of the present invention.

FIG. 6A is a simulation diagram that illustrates the output signals in the level shifting circuit of FIG. 1, and FIG. 6B is a simulation diagram that illustrates the output signals in the level shifting circuit of FIG. 4.

Referring to FIGS. 5A and 5B, the single-ended input signal SIN is changed into the first and second input signals IN and INB that have substantially matched duty ratios.

Referring to FIG. 6A, when the input signals IN and INB have voltage levels of about 1.2[V] at about 300 [MHz], a duty ratio of the output signal OUT is about 54.24:45.76 and a duty ratio of the output signal OUTB is about 45.80:54.20 in the conventional level shifting circuit of FIG. 1. That is, transition timing of the output signals OUT and OUTB are not matched in the conventional level shifting circuit of FIG. 1.

Referring to FIG. 6B, when the first and second input signals IN and INB have voltage levels of about 1.2[V] at about 300 [MHz], a duty ratio of the third output signal OUTB is about 50.1:49.9 and a duty ratio of the fourth output signal OUT is about 50.5:49.5 in the level shifting circuit 400 in FIG. 4 according to some embodiments of the present invention. That is, duty ratios of the third and fourth output signals OUTB and OUT are about 1:1 and are substantially matched with each other.

As described above, the level shifting circuits according to example embodiments of the present invention may match the delay time of the differential input signals through use of transmission gates, which may result in duty ratios of the output signals being substantially the same as each other. Therefore, signals may be correctly transmitted at high speed by improving timing margins for interfacing with other circuitry.

While the example embodiments of the present invention and their advantages have been described in detail, it should be understood that various changes, substitutions and alterations may be made herein without departing from the scope of the invention.

That which is claimed:

1. A level shifting circuit, comprising:
a level shifting unit configured to generate first and second output signals responsive to first and second input signals, respectively, the first and second input signals ranging between first and second voltage levels, the first and second input signals being a first differential pair, the first and second output signals ranging between the first voltage level and a third voltage level greater than the second voltage level, the first and second output signals being a second differential pair, a duty ratio of the first and second output signals being determined based on delay times of the first and second input signals; and
an output buffer unit configured to invert the first and second output signals to provide third and fourth output signals respectively;
wherein the level shifting unit comprises:
an output unit, coupled to a high power supply voltage node, that provides the first and second output signals, the output unit comprising a cross-coupled latch having first and second P-type metal-oxide-semiconductor (PMOS) transistors, a gate terminal of the first PMOS transistor being coupled through the delay control unit to a drain terminal of the second PMOS transistor, a gate terminal of the second PMOS transistor being coupled through the delay control unit to a drain terminal of the first PMOS transistor, source terminals of the first and second PMOS transistor being coupled to the high power supply voltage node, the first and second output signals being provided at the drain terminals of the first and second PMOS transistors, respectively;
an input unit, coupled to the delay control unit and a ground voltage node that receives the first and second input signals, the input unit comprising first and second N-type metal-oxide-semiconductor (NMOS) transistors having gate terminals to which the first and second input signals are respectively provided, and source terminals that are coupled to the ground voltage node; and
a delay control unit, coupled to the output unit, that controls the delay times of the first and second input signals to match duties of the first and second output signals, the delay control unit comprising:
a first transmission gate coupled between the drain terminal of the first PMOS transistor and the drain terminal of the first NMOS transistor; and
a second transmission gate coupled between the drain terminal of the second PMOS transistor and the drain terminal of the second NMOS transistor.

2. The level shifting circuit of claim 1, wherein delay times of the first and second transmission gates are substantially the same.

3. The level shifting circuit of claim 1, wherein the first and second PMOS transistors have thick gate oxide layers for a high power supply voltage.

4. The level shifting circuit of claim 1, wherein the first and second NMOS transistors have thin gate oxide layers for a low power supply voltage.

5. A level shifting circuit, comprising:
an input signal conversion unit coupled between a low power supply voltage node and a ground voltage node, the input signal conversion unit being configured to change a single-ended input signal into first and second input signals that range between first and second voltage levels and have duty ratios substantially matched with each other, the first and second input signals being a first differential pair;
an input unit coupled to the ground voltage node, the input unit being configured to receive the first and second input signals, the input unit comprising first and second N-type metal-oxide-semiconductor (NMOS) transistors having gate terminals to which the first and second input signals are respectively provided, and source terminals that are coupled to the ground voltage node;
a delay control unit coupled to the input unit, the delay control unit being configured to control delay times of the first and second input signals to provide delay time-controlled first and second input signals; and
an output unit coupled to the delay control unit and a high power supply voltage node, the output unit being configured to receive the delay time-controlled first and second input signals to provide first and second output signals that range between the first voltage level and a third voltage level greater than the second voltage level and have duty ratios substantially matched with each other, the first and second output signals being a second differential pair, the output unit comprising a cross-coupled latch having first and second P-type metal-oxide-semiconductor (PMOS) transistors, a gate terminal of the first PMOS transistor being coupled through the delay control unit to a drain terminal of the second PMOS transistor, a gate terminal of the second PMOS transistor being coupled through the delay control unit to a drain terminal of the first PMOS transistor, source terminals of the first and second PMOS transistors being coupled to the high power supply voltage node, the first and second output signals being provided at the drain terminals of the first and second PMOS transistors, respectively; and
an output buffer unit configured to invert the first and second output signals to provide third and fourth output signals, respectively, the output buffer unit comprising:
a first inverter that inverts the first output signal to provide the third output signal; and
a second inverter that inverts the second output signal to provide the fourth output signal;
wherein the delay control unit comprises:
a first transmission gate coupled between the drain terminal of the first PMOS transistor and the drain terminal of the first NMOS transistor; and
a second transmission gate coupled between the drain terminal of the second PMOS transistor and the drain terminal of the second NMOS transistor.

6. The level shifting circuit of claim 5, wherein delay times of the first and second transmission gates are substantially the same.

7. The level shifting circuit of claim 5, wherein the first and second PMOS transistors have thick gate oxide layers for a high power supply voltage.

8. The level shifting circuit of claim 5, wherein the first and second NMOS transistors have thin gate oxide layers for a low power supply voltage.

* * * * *